United States Patent
Park et al.

(10) Patent No.: US 10,950,392 B2
(45) Date of Patent: Mar. 16, 2021

(54) HIGH PERFORMANCE NANO/MICRO COMPOSITE FIBER CAPABLE OF STORING ELECTRICAL ENERGY AND METHOD FOR FABRICATING THEREOF

(71) Applicants: AICT, Suwon-si (KR); PURITECH CO., LTD., Pyeongtaek-si (KR)

(72) Inventors: SangYoon Park, Seoul (KR); MinkYoon Shin, Incheon (KR); HyukJoon Kim, Suwon-si (KR); ChangSu Yeo, Seoul (KR); YunJae Cho, Seoul (KR); KangRae Cho, Pyeongtaek-si (KR)

(73) Assignees: AICT, Suwon-si (KR); PURITECH CO., LTD., Pyeongtaek-si (KR)

( * ) Notice: Subject to any disclaimer, the term of this patent is extended or adjusted under 35 U.S.C. 154(b) by 0 days.

(21) Appl. No.: 16/588,651

(22) Filed: Sep. 30, 2019

(65) Prior Publication Data
US 2020/0043674 A1 Feb. 6, 2020

Related U.S. Application Data

(62) Division of application No. 15/436,356, filed on Feb. 17, 2017, now abandoned.

(51) Int. Cl.
*H01G 11/40* (2013.01)
*H01M 4/583* (2010.01)
*H01G 11/36* (2013.01)
*H01G 11/86* (2013.01)
*H01M 4/04* (2006.01)
(Continued)

(52) U.S. Cl.
CPC ............... *H01G 11/40* (2013.01); *C09D 1/00* (2013.01); *C09D 5/4407* (2013.01); *C09D 5/448* (2013.01); *C09D 7/61* (2018.01); *C09D 7/70* (2018.01); *C23C 14/18* (2013.01); *C23C 14/26* (2013.01); *C23C 24/00* (2013.01); *D01D 5/0007* (2013.01); *D01D 5/06* (2013.01); *D01F 9/12* (2013.01); *H01G 11/26* (2013.01); *H01G 11/36* (2013.01); *H01G 11/54* (2013.01); *H01G 11/86* (2013.01); *H01M 4/04* (2013.01); *H01M 4/583* (2013.01); *B82Y 30/00* (2013.01); *B82Y 40/00* (2013.01); *H01M 4/75* (2013.01);
(Continued)

(58) Field of Classification Search
CPC ........ H01M 4/583; H01G 11/36; H01G 11/40
USPC .......................................................... 429/127
See application file for complete search history.

(56) References Cited

U.S. PATENT DOCUMENTS

2014/0001417 A1 1/2014 Kim et al.
2014/0004344 A1 1/2014 Kim et al.
(Continued)

FOREIGN PATENT DOCUMENTS

KR 10-2016-0079333 A 7/2016

*Primary Examiner* — James M Erwin
(74) *Attorney, Agent, or Firm* — Birch, Stewart, Kolasch & Birch, LLP

(57) ABSTRACT

Provided a nano/micro composite fiber of the present invention, capable of storing electrical energy, comprising (a) one or more pairs of microfiber bundles consisting of graphene or graphene/carbon nanotube as an electrode active material; (b) nanofiber web surrounding the microfiber bundles, wherein the nanofiber web is coated by one or more materials selected from the group consisting of metal, carbon nanotube, activated carbon and metal oxide nanoparticle; (c) an electrolyte layer surrounding the nanofiber web and filling inner void of the microfibers and nanofiber web; (d) an insulating film sheathing the electrolyte layer.

20 Claims, 6 Drawing Sheets

(51) Int. Cl.

| | |
|---|---|
| *D01D 5/06* | (2006.01) |
| *D01D 5/00* | (2006.01) |
| *D01F 9/12* | (2006.01) |
| *C09D 5/44* | (2006.01) |
| *C09D 7/40* | (2018.01) |
| *C23C 24/00* | (2006.01) |
| *C09D 1/00* | (2006.01) |
| *C09D 7/61* | (2018.01) |
| *C23C 14/18* | (2006.01) |
| *H01G 11/26* | (2013.01) |
| *C23C 14/26* | (2006.01) |
| *H01G 11/54* | (2013.01) |
| *B82Y 30/00* | (2011.01) |
| *H01M 4/75* | (2006.01) |
| *H01M 10/04* | (2006.01) |
| *B82Y 40/00* | (2011.01) |

(52) U.S. Cl.
CPC .... *H01M 10/0422* (2013.01); *H01M 10/0436* (2013.01); *H01M 2300/0085* (2013.01)

(56) References Cited

U.S. PATENT DOCUMENTS

| | | |
|---|---|---|
| 2014/0011027 A1 | 1/2014 | Kim et al. |
| 2015/0064603 A1 | 3/2015 | Smithyman et al. |

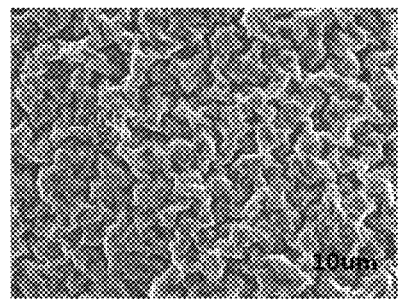 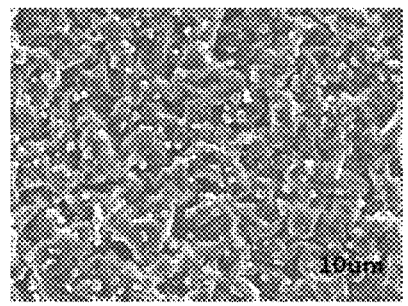
FIG.3(a)  FIG.3(b)
FIG.4
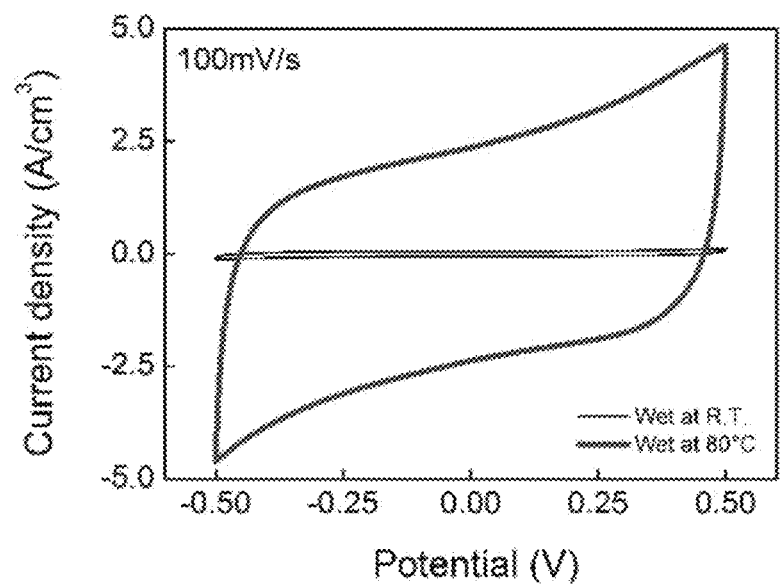

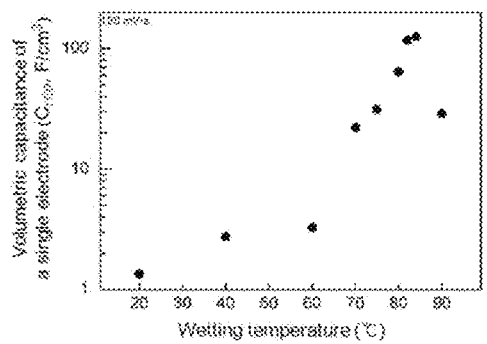
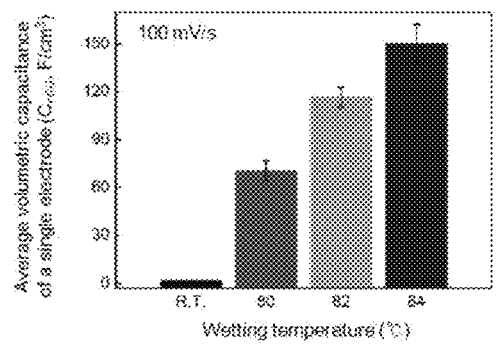
FIG.5 (a)                FIG.5 (b)
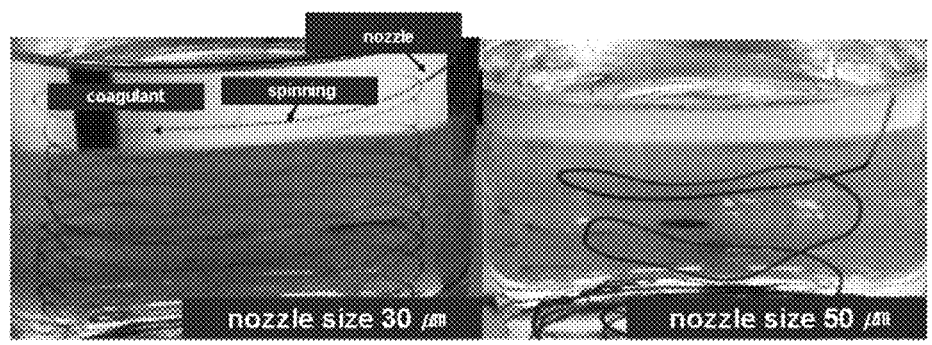
FIG.6(a)                FIG.6(b)

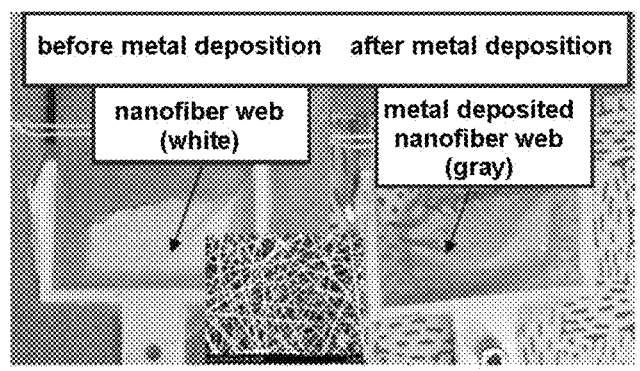 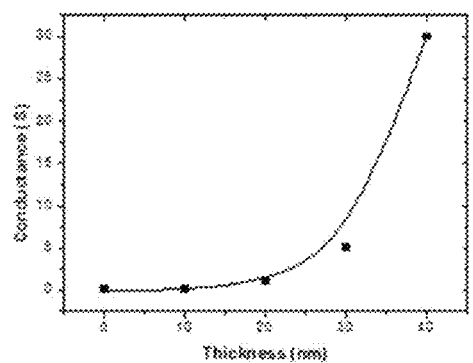
FIG.7(a)  FIG.7(b)  FIG.7(c)
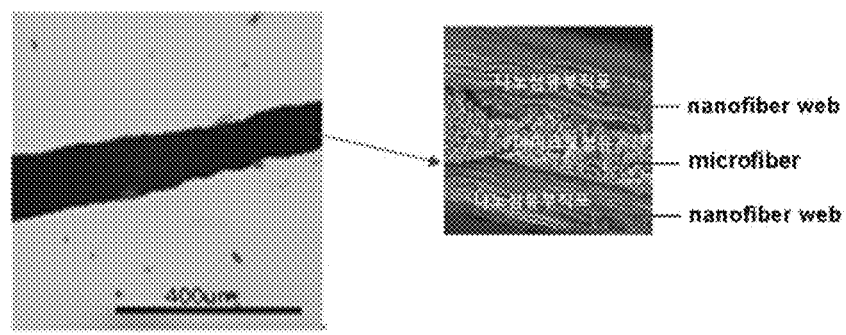
FIG.8(a)  FIG.8(b)

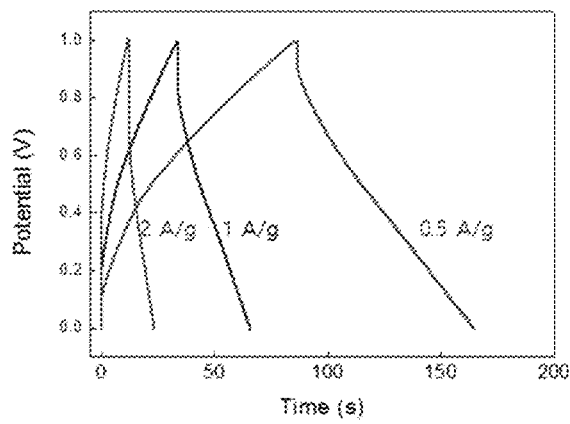
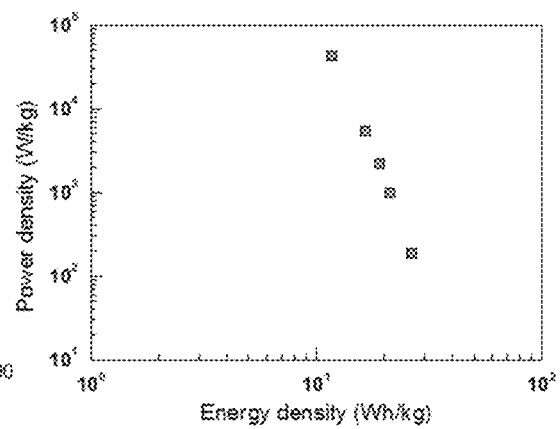
FIG.9(a)  FIG.9(b)
FIG.10
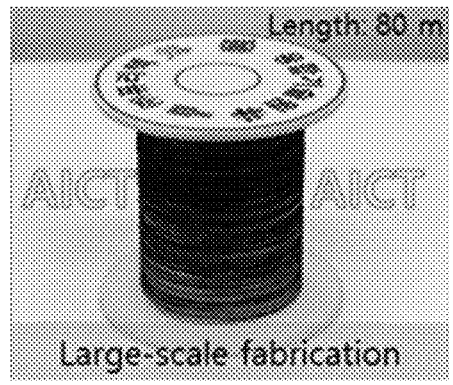
FIG.11
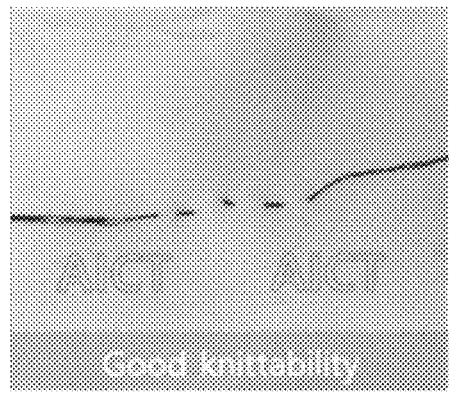

HIGH PERFORMANCE NANO/MICRO COMPOSITE FIBER CAPABLE OF STORING ELECTRICAL ENERGY AND METHOD FOR FABRICATING THEREOF

CROSS-REFERENCE TO RELATED APPLICATIONS

This application is a Divisional of co-pending application Ser. No. 15/436,356, filed on Feb. 17, 2017. The above application is hereby expressly incorporated by reference into the present application.

FIELD OF THE INVENTION

The present invention relates to a high performance nano/micro composite fiber capable of storing electrical energy and a method of fabricating thereof.

TECHNICAL BACKGROUND OF THE INVENTION

Recently electronic devices have rapidly evolved from rigid silicon-based electronic devices to flexible electronic devices and are now evolving from flexible electronic devices to wearable electronic devices. As it is predicted that the skin-attachable flexible electronic devices will be spotlighted in the future, a variety of research studies are conducted to manufacture wearable devices based on a flexible material as an electrical energy storage source.

A fibrous electrical energy storage device does not need to carry a heavy battery separately because the cloth itself is a power supply source. It is very useful for daily, industrial, and military purposes in that it does not interfere with human activity and also creates high added value. A skin-attachable fiber capable of storing electrical energy is required to be harmless to the human body and not to be explosive. Therefore, supercapacitor-based electrical energy storages are mainly studied for skin-attachable electronic devices in that supercapacitors are safer and simpler than lithium secondary batteries.

Nano carbon materials such as graphene and carbon are very flexible and electrically conductive, and have high specific surface area, so these are mainly studied to use as electrodes or electrode active materials for supercapacitors, sensors, batteries, actuators and so on. However, the conventional graphene-based and/or carbon nanotube-based composite fibers were difficult to satisfy all of the fibrous toughness, mechanical strength and the electrical energy storage capability such as high electrical density, power density. A polymer binder, which is added to increase the bonding force of graphene and carbon nanotube for the purpose of the improvement of the fibrous mechanical strength, increases the equivalent series resistance, and decreases the electrical density and the power density, so the capability of the electrical energy storage is lowered.

SUMMARY OF THE INVENTION

In an aspect, the present invention provides a nano/micro composite fiber capable of storing electrical energy, comprising (a) one or more pairs of microfiber bundles consisting of graphene or graphene/carbon nanotube as an electrode active material; (b) nanofiber web surrounding the microfiber bundles, wherein the nanofiber web is coated by one or more materials selected from the group consisting of metal, carbon nanotube, activated carbon and metal oxide nanoparticle; (c) an electrolyte layer surrounding the nanofiber web and filling inner void of the microfibers and nanofiber web; (d) an insulating film sheathing the electrolyte layer.

The graphene may be a reduced graphene oxide. The graphene may have an acid group, preferably a carboxyl group (—COOH), at the edge or on the surface thereof.

The carbon nanotube may have a sulfonic acid group ($SO_3^-$) on the surface thereof.

The composite fiber of claim 1, wherein the graphene or graphene/carbon nanotube microfibers are modified by heating at a temperature between 60° C. and 100° C., preferably between 75° C. and 90° C., more preferably between 80° C. and 85° C., most preferably at 84° C. in the presence of a strong acid. The strong acid can be selected from sulfuric acid, nitric acid, hydrochloric acid, or a mixed acid thereof, preferably sulfuric acid. The material of the nanofiber is polymer.

The metal of the nanofiber web can be one or more selected from the group consisting of aluminum, copper, silver, gold, chromium, nickel, platinum, titanium and an alloy thereof. And the metal oxide nanoparticle of the nanofiber web can be one or more selected from the group consisting of manganese dioxide ($MnO_2$), rubidium dioxide ($RuO_2$), and gadolinium oxide ($Gd_2O_3$).

In another aspect, the present invention provides a method for fabricating a nano/micro composite fiber capable of storing electrical energy, comprising the steps of (a) wet spinning an aqueous dispersion of graphene or graphene/carbon nanotube to prepare a microfiber; (b) bundling the microfibers to prepare microfiber bundle; (c) wrapping the microfiber bundle with a nanofiber web to prepare a nano/micro composite fiber, wherein the nanofiber web is coated with one or more materials selected from the group consisting of metal, carbon nanotube, activated carbon, and metal oxide nanoparticle; (d) impregnating the nano/micro composite fiber with an electrolyte to form a electrolyte layer; (e) sheathing the electrolyte-coated nano/micro composite fiber with insulating material.

BRIEF DESCRIPTION OF THE DRAWINGS

FIG. 3(a) shows a SEM image of the rGO paper which has been immersed in 4M aqueous solution of sulfuric acid, and FIG. 3(b) shows a SEM image of the rGO paper which further was heated at 80° C. after immersion of FIG. 3(a).

FIG. 4 shows a cyclic voltammetry graph of rGO papers of FIG. 3(a) and FIG. 3(b), wherein, the internal area of the black line means the amount of electrical energy storage of rGO paper at FIG. 3(a), and the internal area of the red line means the amount of the electrical energy storage of rGO paper at FIG. 3(b).

FIG. 5(a) shows an average voltammetry capacitance of rGO electrodes after 4M sulfuric acid treatment and heat treatment between 20° C. and 90° C., and FIG. 5(b) shows an average voltammetry capacitance of rGO electrodes after 4M sulfuric acid treatment and heat treatment at 80° C., 82° C. and 84° C.

FIG. 6(a) shows a wet-spun rGO/CNT microfiber through a 30 μm spinning nozzle and FIG. 6(b) shows a wet-spun rGO/CNT microfiber through a 50 μm spinning nozzle according to an embodiment.

FIG. 7(a) shows an image of nanofiber web according to an embodiment, and FIG. 7(b) shows an image of metal-deposited nanofiber web, and FIG. 7(c) shows the conductance according to metal thickness of nanofiber web.

FIG. 8(a) shows an optical microscope image of a graphene/CNT composite fiber fabricated according to an embodiment, and FIG. 8(b) shows an SEM image of cross-section view of FIG. 8(a).

FIG. 9(a) shows a Galvanostatic charging/discharging graph of nano/micro composite fiber according to an embodiment and FIG. 9(b) shows a Ragone chart of nano/micro composite fiber according to an embodiment.

FIG. 10 shows large scale fabrication of graphene(rGO) microfiber according to another embodiment (Length of fiber: 80 m).

FIG. 11 shows high knittability of the rGO microfiber of FIG. 10.

DETAILED DESCRIPTION OF THE INVENTION

Figure 1:
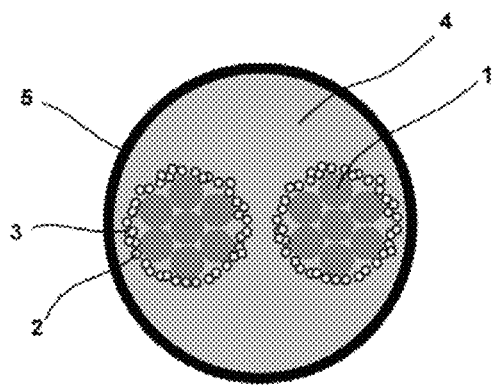
FIG. 1 schematically shows a cross-sectional view of a nano/micro composite fiber capable of storing electrical energy according to an embodiment.

This disclosure will be described more fully in the following detailed description, and with reference to the accompanying drawings, in which some but not all embodiments of the disclosure are disclosed. This disclosure may, however, be embodied in many different forms and is not to be construed as limited to the exemplary embodiments set forth herein; rather, these embodiments are provided so that this disclosure will be thorough and complete, and will fully convey the scope of the invention to those skilled in the art. Like reference numerals and variables refer to like elements throughout.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes," and/or "including" when used in this specification, specify the presence of stated features, regions, integers, steps, operations, elements, and/or components, but do not preclude the presence or addition of one or more other features, regions, integers, steps, operations, elements, components and/or groups thereof.

Unless otherwise defined, all terms (including technical and scientific terms) used herein have the same meaning as commonly understood by one of ordinary skill in the art to which this invention belongs.

The present invention provides a nano/micro composite fiber capable of storing electrical energy, comprising (a) one or more pairs of microfiber bundles consisting of graphene or graphene/carbon nanotube as an electrode active material; (b) nanofiber web surrounding the microfiber bundles, wherein the nanofiber web is coated by one or more materials selected from the group consisting of metal, carbon nanotube, activated carbon and metal oxide nanoparticle; (c) an electrolyte layer surrounding the nanofiber web and filling inner void of the microfibers and nanofiber web; (d) an insulating film sheathing the electrolyte layer.

The present invention provides a method for fabricating a nano/micro composite fiber capable of storing electrical energy, comprising the steps of (a) wet spinning an aqueous dispersion of graphene or graphene/carbon nanotube to prepare a microfiber; (b) bundling the microfibers to prepare microfiber bundle; (c) wrapping the microfiber bundle with a nanofiber web to prepare a nano/micro composite fiber, wherein the nanofiber web is coated with one or more materials selected from the group consisting of metal, carbon nanotube, activated carbon, and metal oxide nanoparticle; (d) impregnating the nano/micro composite fiber with an electrolyte to form an electrolyte layer; (e) twisting one or more pairs of electrolyte-coated nano/micro composite fibers; (f) sheathing the electrolyte-coated nano/micro composite fiber with insulating material.

Figure 2:
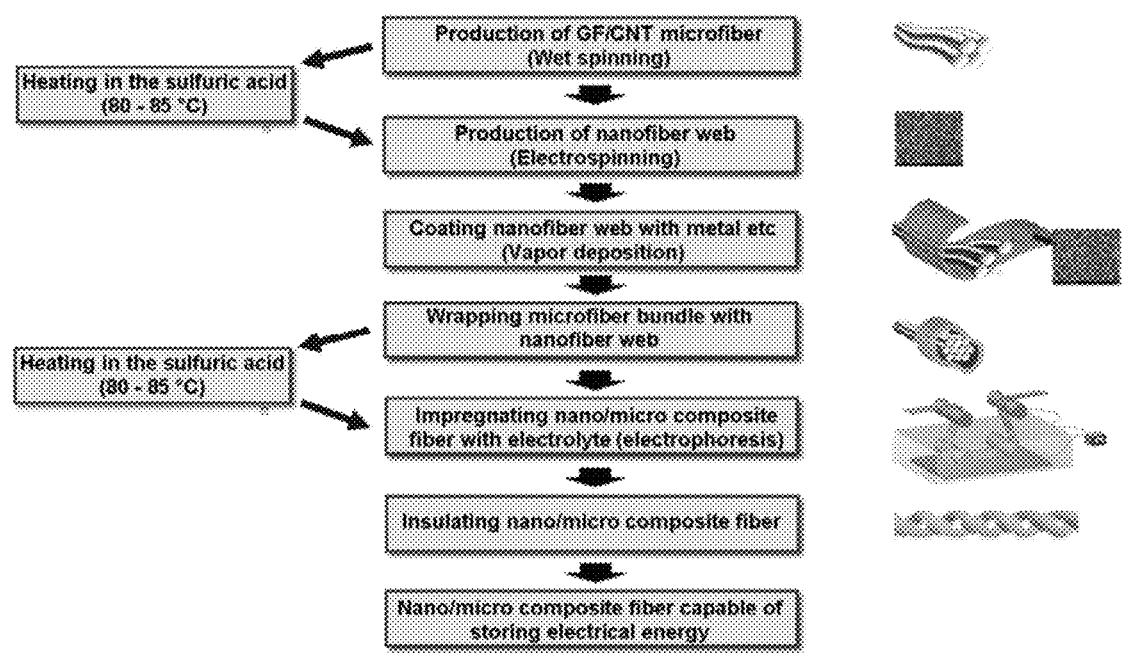
FIG. 2 shows a process diagram of fabricating a nano/micro composite fiber capable of storing electrical energy according to an embodiment.

FIG. 1 schematically shows a cross-sectional view of a composite fiber capable of storing electrical energy according to an embodiment. FIG. 2 shows a process diagram of fabricating a nano/micro composite fiber capable of storing electrical energy according to an embodiment.

As shown in FIG. 1, the composite fiber of the present invention, capable of storing electrical energy, comprises a pair of a microfiber bundles 1, which are consisting of graphene, or the combination of graphene and carbon nanotube (hereinafter 'graphene/carbon nanotube'). The microfibers of the bundle can be parallel, twisted or braided structure between microfibers, preferably twisted or braided structure. The microfiber may have micropores (voids) on the surface thereof. This micropores may be formed by add an acid and heating at the particular temperature condition according to the present invention. Also micropores(voids) may exist between microfibers. The fiber bundle of the present invention has high electrical conductivity and specific surface area and acts as an electrode active material and/or an electrode of a supercapacitor.

Meanwhile, another of the main features of the present invention is that the microfibers of the graphene or graphene/carbon nanotube is immersed in a strong acid, preferably dilute sulfuric acid, the heated at a temperature between 60 and 100° C., more preferably between 80° C. and 85° C. to modify the surface of graphene. The capability of electrical energy storage is remarkably improved by conducting the above acid and heat treatment. As it is first disclosed in the present invention, the inventors found that when the graphene was heated between 80° C. and 85° C. for 1 hour in the 4M sulfuric acid, the capability of electrical energy storage increased about 44 times.

A nanofiber web 2 surrounds the microfiber bundle 1, thereby the nanofiber 1 and the microfiber 2 are densely in contact with each other. The material of the nanofiber web 2, which is comprising polymer, effectively improves the mechanical properties of the composite fiber of the present invention. The nanofiber web may preferably have a mesh or non-woven fabric structure. In the present invention, the surface of the nanofiber web is coated with a functional material 3 selected from metal, carbon nanotube, activated carbon, and metal oxide nanoparticle. Because a metal, carbon nanotube and activated carbon have high electrical conductivity, these rapidly and effectively transfer the electrons charged on the microfiber, so improve the energy output density of the composite fiber of the present invention, and the metal oxide nanoparticle effectively improves the energy storage density of the composite fiber of the present invention.

An electrolyte 4, which acts as dielectric material of supercapacitor, surrounds the nanofiber web 2. Also this electrolyte fills micropores (voids) formed on the surface of the microfiber and between microfibers. The electrolyte is but limited to a solid electrolyte, gel electrolyte, polymer electrolyte and liquid electrolyte.

The filling of electrolyte 4 may be conducted by impregnating the metal-coated nano/micro composite fiber with electrolyte solution. Subsequently electrolyte-coated(impregnated) nano/micro composite fiber may be dried.

A pair of electrolyte-coated nano/micro composite fiber may be twisted each other to form the structure of capacitor. As needed, further filling of electrolyte may be conducted after twisting the pair of microfiber bundles, to fill voids the between microfiber bundles.

An insulating material was coated at the pair of electrolyte-coated nano/micro composite fibers to form insulating film.

Graphene

In the present invention, the term "graphene" comprises a reduced graphene oxide (hereinafter "rGO"), which is thermally or chemically reduced. Also a graphene comprised chemically modified graphene, chemically modified rGO. The graphene comprises a single layer of graphene, two layers of graphene, three layers of graphene or four layers of graphene.

The term "graphene flake" (hereinafter "GF") means a fragment of graphene, and the average length of the GF in the present invention is preferably between 100 and 1,000 nm. The graphene has high specific surface area and high conductivity, therefore, it is very suitable of an energy storage device.

A variety of techniques are well known to produce a graphene such as Chemical vapor deposition (CVD), Epitaxial growth, Chemical exfoliation, Non-oxidative exfoliation.

In the present invention, the method of manufacture a graphene is but not limited to CVD, Epitaxial growth, Chemical exfoliation, Non-oxidative exfoliation as described above. When considering the mass productivity and costs, the Chemical exfoliation is very useful and provides a GF with the average length of 100 to 1,000 nm. Therefore, the graphene of the present invention is preferably the rGO isolated from graphite by chemical exfoliation and reduced by chemical treatment or heat treatment at the high temperature. Also the graphene of the present invention may be chemically modified graphene, chemically modified rGO. In the cases of graphene/carbon nanotube of the present invention, the graphene preferably has an acid group at the edge and/or on the surface thereof in order to chemically bond with the carbon nanotube. The acid group improves the mechanical properties of the microfiber by strong hydrogen bonding with a surfactant bonded to the carbon nanotube. The acid group is preferably carboxyl group (—COOH), and is effectively hydrogen-bonded to the sulfonic acid group ($SO_3^-$) of the modified carbon nanotube.

A graphene oxide (hereinafter "GO") prepared by the chemical exfoliation mainly has epoxy group and hydroxyl group on the graphene surface, and has various functional groups such as carboxyl group, phenol group, lactone group, ketone group, pyrone group and lactate group at the edge thereof. Although a GO may be used in the present invention, a rGO is more useful than GO because the electrical conductivity of GO is weakened by the presence of functional groups at the edge or on the surface thereof. A variety of chemical reduction agents such as hydrazine, hydrazine hydrate, hydroquinone, sodium borohydride, ascorbic acid and glucose are already known for the reduction of the GO. The electrical conductivity of graphene is effectively improved by reduction. It has been reported that reduction by hydrazine hydrate improves the electrical conductivity about 26 times in comparison with GO. Chemical reducing agents such as hydrazine, hydrazine hydrate, sodium hydride or sodium borohydride effectively remove the epoxy group and/or the hydroxy group on the surface of the GO, but cannot effectively remove the carboxyl group or the carbonyl group at the edge of the GO. Therefore, rGO can be usefully used in the present invention because the carboxyl group or the carbonyl group of the rGO effectively bond to the sulfonic acid group ($SO_3^-$) of the modified carbon nanotube. When reduction is carried out at high temperature with concentrated sulfuric acid, the hydroxy group on the surface of graphene can be effectively removed.

A graphene or rGO is known difficult to dissolve in water, whereas GO is known to dissolve and disperse in water since there are acid groups, especially a carboxyl group, at the edge or surface as described above. Ultrasonication or surfactants may be used for effective dispersion.

Carbon Nanotube

A carbon nanotube (hereinafter 'CNT') in the present invention comprise a single-walled carbon nanotube (SWNT), a double-walled carbon nanotube(DWNT), a multi-walled carbon nanotube (MWNT). Although a MWNT can be applicable in the present invention, preferably DWNT, more preferably SWNT is more useful in consideration of electrical conductivity and mechanical properties. A CNT is non-polar and poorly soluble in water and polar solvents, therefore, it is preferable to disperse the CNT in water by using hydrophilic surfactants and ultrasonication. The surfactant can be selected from anionic surfactants having hydrophilic sulfonic acid groups ($SO_3^-$) such as sodium dodecylbenzenesulfonate (SDBS), sodium dodecylsulfonate (SDS), sodium lignosulfonate (SLS), sodium laureth sulfosuccinate (SLES), sodium lauryl ether sulfonate (SLES), cationic surfactants such as cetyltrimethylammonium bromide (CTAB), cetyltrimethylammonium chloride (CTAC), cetylpyridinium chloride (CPC), sodium myreth sulfate, dodecyltrimethylammonium bromide (DTAB), tetradecyltrimethylammonium bromide (TTAB), dioctadecyldimethylammonium bromide (DODAB), dimethyl dioctadecylammonium chloride (DODMAC), nonionic surfactants such as Tween 20, Tween 40, Tween 60, Tween 80, Triton X-100, glycerol alkyl esters, glyceryl laurate esters, and polyoxyethylene glycol sorbitan alkyl esters. In the present invention, it is but not limited preferably to disperse CNT in water with anionic surfactants having a hydrophilic sulfonic acid group ($SO_3^-$). Also ultrasonication may be helpful to disperse CNT in water.

Fabrication of GF/CNT Microfiber

The diameter of the GF/CNT-based microfibers according to the present invention is less than 1 mm, preferably several to several hundreds of micron, and can be fabricated by wet spinning processes. Wet spinning processes are described at several papers ("Hybrid Nanomembrane for High Power and High Energy Density Supercapacitors and Their Yarn Application", J. A. Lee et al., *ACS Nano* 6, 327-334 (2012)).

The spinning solution may be prepared in the form of 5 to 30 wt % GF/CNT aqueous dispersion, and CTAB solution at concentration of 1 mg/mL or 37% hydrochloric acid as coagulation solution can be used but limited thereto.

The weight ratio of GF:CNT is preferably in the range of 9:1 to 1:10, more preferably 1:1.

The spinning solution may be prepared by mixing GF aqueous dispersion and CNT aqueous dispersion. The GF having an acid group are easy to disperse in water, but dispersion of the GF can be improved by adding surfactant and/or ultrasonication. GF without acid groups are low in water solubility and can be dispersed by adding the surfactants and/or by ultrasonication as described above. Since CNT has low water solubility, they can be dispersed by the above-mentioned surfactant and/or ultrasonication. The CNT is preferably modified with an anionic surfactant having a sulfonic acid group ($SO_3^-$) such as sodium dodecylbenzenesulfonate (SDBS) or sodium dodecylsulfonate (SDS). In the present invention, the carboxyl group (—COOH) of the GF and the sulfonic acid group ($SO_3^-$) of the CNT can be hydrogen bonded and self-aligned in the direction of the fiber axis to increase the toughness of GF/CNT microfiber.

Nanofiber Web

The nanofiber web of the present invention is in the form of mesh structure, a nonwoven fabric having an amorphous fiber arrangement, and many nanopores are formed between the nanofibers. The diameter of the nanofibers is less than 1 µm, preferably several tens to several hundreds of nanometers. Since the nanofiber web densely surrounds the microfiber bundle, the toughness and mechanical strength of the nano/micro composite fiber of the present invention can be effectively increased.

The nanofibers can be obtained by well-known spinning methods such as electrospinning, centrifugal electrospinning, flash-electrospinning electrospray, and electrospinning spinning.

The material of the nanofiber is but limited to polyvinyl alcohol (PVA), polyvinyl pyrrolidone (PVP), polymethyl methacrylate (PMMA), polymethacrylic acid (PMAA), polyacrylic acid (PAA), polyvinyl chloride, polylactic acid (PLA), polycaprolactone (PCL), polyurethane (PU), polystyrene (PS), polyethylene oxide (PEO), polyvinyl acetate (PVAC), polyacrylonitrile (PAN), nylon, polyetherimide (PC), polyetherimide (PEI), polyester (PET), polyester sulfone (PES) and polybenzimidazole (PBI).

The solvent of the polymer is but limited to N,N-dimethylformamide (DMF), dimethylsulfoxide (DMSO), dimethylacetamide (DMA), N-methyl-2-pyrrolidinone (NMP), tetrahydrofuran (THF) not limited thereto, THF, ethylene carbonate (EC), diethyl carbonate (DEC), dimethyl carbonate (DMC), ethyl methyl carbonate (EMC), propylene carbonate (PC), water, acetic acid, acetone and so on.

Coating Material of Nanofiber Web

In the present invention, the term "coating" is used to mean including "deposition". The surface of the nanofibers is coated with a material to improve the electrical properties or electrical energy storage. The material coated on the nanofiber web is selected from metals, carbon nanotube, activated carbon, and metal oxide nanoparticles.

The coating material may be selected according to the purpose of the composite fiber of the present invention.

A metal, carbon nanotube and activated carbon coated on the nanofiber web improve the energy output density of the composite fiber of the present invention because these can rapidly and effectively transfer the electrons charged on the GF/CNT microfiber. The metal oxide nanoparticle effectively improves the energy storage density of the composite fiber of the present invention.

The metal coated on the nanofiber web is but limited to aluminum, copper, silver, gold, chromium, nickel, platinum, titanium or an alloy thereof. The metal can be deposited or coated on the surface of nanofiber web by metal vapor deposition, metal particle injection. The metal vapor deposition may be performed by conventional methods such as Resistive heating evaporation, Sputtering, Ion plating, Arc deposition, or Ion beam assisted deposition. The thickness of the metal layer is in the range of 1 nm to 1 µm, preferably in the range of 20 to 500 nm. At an experiment of the present invention, the thickness of metal layer is 20 nm or more, the electrical conductivity of the composite fiber was remarkably improved.

The metal oxide nanoparticle is but limited to manganese dioxide ($MnO_2$), rubidium dioxide ($RuO_2$), gadolinium oxide ($Gd_2O_3$).

The metal-coated nanofiber web may be cut to an appropriate width, and spirally wrapped around the microfiber bundle.

Filling of Electrolyte

Electrical energy storage occurs at the interface between the electrolyte and the electrode material. Therefore, the characteristics of electrolyte as well as the interface area are very important.

GF/CNT microfibers of the present invention are very useful as electrode materials because they have high porosity and specific surface area. Electrolytes are classified into liquid electrolytes, gel electrolytes, and solid electrolytes including polymer electrolytes depending on the material phase. In the present invention, a gel electrolyte, and a solid electrolyte (including a polymer electrolyte), liquid electrolyte can be applied as the electrolyte.

The gel electrolyte is but not limited to alkaline electrolytes such as PVA-NaOH and PVA-KOH as well as acidic electrolytes such as PVA-$H_2SO_4$, PVA-$Na_2SO_4$, PVA-$HClO_4$, PVA-$H_3PO_4$, PVA-CN, Pullulan-CN, PEO and PAN. The solid electrolytes is but not limited to $RbAg_4I_5$, zirconium oxide ($ZrO_2$), sodium beta-alumina and AgI. The polymer electrolyte may also be applied to the present invention. The liquid electrolyte is but not limited to acidic aqueous solutions such as $H_2SO_4$, $HClO_4$ and $H_3PO_4$, alkaline aqueous solutions such as NaOH and KOH, organic electrolytes such as $TEABF_4$/propylene carbonate and $TEABF_4$/acetonitrile.

The electrophoresis of electrolyte may be performed to rapidly penetrate the electrolyte into the voids of the nano/micro composite fiber.

Modification of the Surface of GF or GF/CNT Microfibers by Heat Treatment in the Strong Acid.

According to the present invention, when the GF and the CNT material are heated at a temperature between 60° C. and 100° C., preferably between 75° C. and 90° C., more preferably between 80° C. and 85° C., in a strong acid, preferably dilute sulfuric acid, nitric acid, hydrochloric acid, more preferably dilute sulfuric acid, the capability of electrical energy storage is remarkably improved as the specific surface area increased.

As it is first disclosed in the present invention, the inventors found that when the graphene was heated between 80° C. and 85° C. for 1 hour in the 4M sulfuric acid, the capability of electrical energy storage increased about 44 times.

FIG. 3(a) shows a SEM image of the rGO paper which has been immersed for 30 minutes in 4M aqueous solution of sulfuric acid, and FIG. 3(b) shows a SEM image of the rGO paper which further was heated at 80° C. for 1 hour after immersion of FIG. 3(a).

FIG. 4 shows a cyclic voltammetry graph of rGO papers of FIG. 3(a) and FIG. 3(b), wherein, the internal area of the black line means the amount of electrical energy storage of rGO paper at FIG. 3(a), and the internal area of the red line means the amount of the electrical energy storage of rGO paper at FIG. 3(b). As shown in FIG. 4, the curve area of the surface-modified graphene which was heated at 80° C. was increased about 44 times.

FIG. 5(a) shows an average voltammetry capacitance of rGO electrodes after 4M sulfuric acid treatment and heat treatment at 20° C., 40° C., 60° C., 70° C., 80° C. and 90° C. As shown in FIG. 5(a), it was confirmed that the volumetric capacitance significantly increased at 70° C., 80° C., and 90° C., and the maximum peak shows at 80° C.

As further experiments, FIG. 5(b) shows an average voltammetry capacitance of rGO electrodes after 4M sulfuric acid treatment and heat treatment at 80° C., 82° C. and 84° C.

The acid and heat treatment process of GF or GF/CNT microfibers may be preferably carried out before the step of wrapping with the nanofiber web, but it is also useful to carry out after the wrapping. The ionization of the copper, silver deposited on the nanofiber web by the sulfuric acid heat treatment after the wrapping of the nanofibers was found to be insignificant.

Insulating Film Treatment

The insulating film of the nanofiber web is to prevent short-circuiting of the metal layer with the external environment, leakage of electrolyte, and protection of the core from external impact. The insulating film can be formed by coating, injecting or spinning method and can be sheathed by insulating material well known in the technical art of an electric wire coating.

EMBODIMENT 1

(1) Production of Graphene/CNT Microfibers

FIG. 6(a) shows a wet-spun rGO/CNT microfiber through a 30 μm spinning nozzle and FIG. 6(b) shows a wet-spun rGO/CNT microfiber through a 50 μm spinning nozzle according to an embodiment.

An aqueous dispersion of GFs was prepared by followings; The GFs were obtained by reducing an aqueous dispersion of GOs with excess hydrazine at 95 20 C. for 2 hours in accordance with previously reported methods (Li, D., Muller, M. B., Gilje, S., Kaner, R. B. & Wallace, G. G. Processable aqueous dispersions of graphene nanosheets. Nature Nanotech. 3, 101 (2008)). The GFs aggregated in the aqueous solution and were transferred to a funnel, and then were washed with a large amount of Milli-Q water. The GFs were collected by centrifugation and then the GFs were effectively dispersed in the water by ultrasonication using 1 wt % sodium dodecyl benzene sulfonate (SDBS).

An aqueous dispersion of SWNTs was prepared by ultrasonication with the surfactant of 1 wt % sodium dodecyl benzene sulfonate (SDBS) for 30 minutes.

The aqueous dispersion of GFs and the aqueous dispersion of SWNTs were mixed to prepare a spinning solution of the GF/CNT. Then, the spinning solution was slowly and continuously spun through respectively a 30 μm and 50 μm of spinning nozzle into CTAB aqueous solution as coagulant, then, was continuously dipped in distilled water, washed and dried at room temperature to produce a uniform GF/CNT microfiber.

(2) Production of Metal-Deposited Nanofiber

FIG. 7(a) shows an image of nanofiber web according to an embodiment, and FIG. 7(b) shows an image of metal-deposited nanofiber web, and FIG. 7(c) shows the conductance according to metal thickness of nanofiber web.

Polyvinyl alcohol (PVA), which is a water-soluble polymer, was added to a mixed solvent of water/ethanol (10:1) in an amount of 25 wt % and mixed to prepare a PVA spinning solution.

The PVA spinning solution was transferred to a spinning pack and subjected to electrospinning under the conditions of an applied voltage of 15 kV, a spinning distance of 15 cm between the spinning nozzle and the collector, a spinning rate of 10 μl/min, 30° C. and a relative humidity of 60% to produce nanofiber web (FIG. 7(a)). The diameter of the nanofibers was in the range of 400 to 600 nm, and the average diameter was about 500 nm.

The metal deposition of the nanofiber web was performed by resistive heating evaporation. The prepared nanofiber web was placed in a vacuum chamber, and a tungsten filament as an evaporation source was attached to a water-cooled evaporation source holder, and 5 g of silver was charged. The vacuum pump was operated to evacuate to a vacuum of $8 \times 10^{-5}$ torr, and then argon gas was irradiated on the surface of the nanofiber web using a plasma generator installed in the vacuum chamber. The plasma treatment was carried out at 400 W for 1 minute, and the flow rate of the argon gas was set to 100 sccm (Standard Cubic Centimeter per Minute). After the cleaning of the nanofiber web was completed, the reaction was conducted for 30 seconds at an applied electric power of 8 kW to vaporize the silver to deposit on the surface of the nanofiber web (FIG. 7 (b)). The thickness of the silver layer deposited on the nanofiber web was measured to be about 30 nm.

As a result of the further embodiment on the thickness of the metal layer deposition, as shown in FIG. 7(c), it was confirmed that the conductance was rapidly increased from the metal layer of 20 nm or more.

(3) Wrapping of Microfiber with Metal-Deposited Nanofiber

The microfibers prepared in the above (1) were bundled into several tens of layers and then twisted with an electric motor to prepare microfiber bundle. The twist angle of the microfibers is about 30 degrees.

The metal-deposited nanofiber web prepared in the above (2) were cut to an appropriate width, and the nanofibers were spirally wrapped around the microfiber bundle.

(4) Filling of Electrolyte and Insulating

The fibers prepared in above (3) were impregnated with a $H_2SO_4$/PVA gel electrolyte and then subjected to electrophoresis so that the aqueous solution of $H_2SO_4$/PVA gel electrolyte was effectively penetrated into voids(micropores) of microfibers and nanofiber webs.

The composite fiber thus prepared is shown in FIG. 8(a) is an optical microscope photograph of a composite fiber produced according to an embodiment of the present invention, and (b) is an electron microscope photograph.

FIG. 9(a) shows a Galvanostatic charging/discharging graph of nano/micro composite fiber according to an embodiment. As shown in FIG. 9(a), It was observed that charging/discharging was normal even though a slight potential drop occurred due to internal resistance at 2 A/g.

Ragone charts were created to evaluate the energy storage density and power density of nano/micro composite fiber according to an embodiment. FIG. 9(b) shows a Ragone chart of nano/micro composite fiber according to an embodiment. As shown in FIG. 9(b), it was observed that it has a high output density of about 200 Wh/kg and an energy density of 100 W/kg.

A pair of GF/CNT composite fibers were twisted, were furtherly impregnated with a $H_2SO_4$/PVA gel electrolyte.

The electrolyte coated GF/CNT composite fiber was sheathed by insulating material.

FIG. 10 shows supercapacitor which applied nano/micro composite fiber according to an embodiment.

EMBODIMENT 2

The GF spinning solution was slowly and continuously spun through respectively a 30 μm of spinning nozzle into CTAB aqueous solution as coagulant, then, was continuously dipped in distilled water, washed and dried at room temperature to produce a uniform GF microfiber.

FIG. 10 shows large scale fabrication of graphene(rGO) microfiber according to above embodiment (Length of fiber: 80 m).

As shown in FIG. 11, the rGO microfiber of FIG. 10 shows high knittability.

A nanofiber web was produced by electrospinning with 25 wt PVA spinning solution (solvent of water:ethanol=10:1) under the conditions of applied voltage of 15 kV, a spinning distance of 15 cm between the spinning nozzle and the collector, a spinning rate of 10 μl/min, 30° C. and a relative humidity of 60%.

Silver was deposited on the nanofiber web by resistive heating evaporation. The thickness of the silver layer deposited on the nanofiber web was measured to be about 30 nm.

The rGO microfibers prepared in the above were bundled into several tens of layers and then twisted with an electric motor to prepare microfiber bundle. The twist angle of the microfibers is about 30 degrees.

The silver-deposited nanofiber web prepared in the above (2) were cut to an appropriate width, and the nanofibers were spirally wrapped around the microfiber bundle.

The silver-deposited nano/micro composite fibers prepared in the above were impregnated with a $H_2SO_4$/PVA gel electrolyte and then subjected to electrophoresis so that the aqueous solution of $H_2SO_4$/PVA gel electrolyte was effectively penetrated into voids(micropores) of microfibers and nanofiber webs.

PVC as insulating material was sheathed the electrolyte-coated and silver-deposited nano/micro composite fibers.

Figure 12:
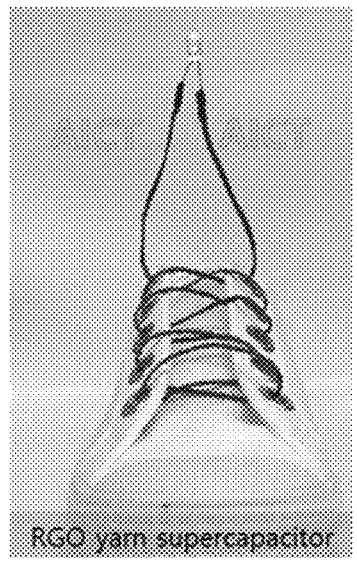
FIG. 12 shows high performance supercapacitor which applied nano/micro composite fiber according to an embodiment.

FIG. 12 shows high performance supercapacitor which applied nano/micro composite fiber according to the embodiment.

Figure 13:
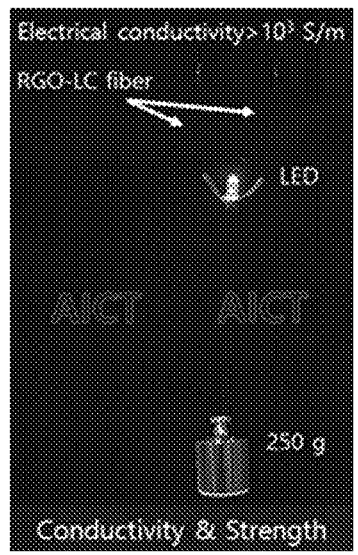
FIG. 13 shows high mechanical strength of nano/micro composite fiber according to another embodiment (weight: 250 g).

FIG. 13 shows high mechanical strength of nano/micro composite fiber according to the embodiment (weight: 250 g).

The invention claimed is:

1. A method for fabricating a nano/micro composite fiber capable of storing electrical energy, comprising:
   wet spinning an aqueous dispersion of graphene or graphene/carbon nanotube to prepare a microfiber;
   bundling the microfibers to prepare a microfiber bundle;
   heating the microfiber at a temperature between 60° C. and 100° C. under a strong acid to modify the surface of microfibers;
   wrapping the microfiber bundle with a nanofiber web to prepare a nano/micro composite fiber, wherein the nanofiber web is coated with one or more materials selected from the group consisting of metal, carbon nanotube, activated carbon, and metal oxide nanoparticle;
   impregnating the nano/micro composite fiber with an electrolyte to form an electrolyte layer;
   twisting one or more pairs of electrolyte-coated nano/micro composite fibers;
   sheathing the electrolyte-coated nano/micro composite fiber with insulating material.

2. A method for fabricating a nano/micro composite fiber capable of storing electrical energy, comprising:
   wet spinning an aqueous dispersion of graphene or graphene/carbon nanotube to prepare a microfiber;
   bundling the microfibers to prepare a microfiber bundle;
   wrapping the microfiber bundle with a nanofiber web to prepare a nano/micro composite fiber, wherein the nanofiber web is coated with one or more materials selected from the group consisting of metal, carbon nanotube, activated carbon, and metal oxide nanoparticle;
   heating the microfiber at a temperature between 60° C. and 100° C. under a strong acid to modify the surface of microfibers;
   impregnating the nano/micro composite fiber with an electrolyte to form an electrolyte layer;
   twisting one or more pairs of electrolyte-coated nano/micro composite fibers;
   sheathing the electrolyte-coated nano/micro composite fiber with insulating material.

3. The method of claim 1, wherein, the heating is performed at a temperature between 80° C. and 85° C.

4. The method of claim 1, wherein the strong acid is selected from sulfuric acid, nitric acid or hydrochloric acid, or a mixed acid thereof.

5. The method of claim 1, wherein the graphene is a reduced graphene oxide.

6. The method of claim 1, wherein the material of the nanofiber is one or more selected from the group consisting of polyvinyl alcohol (PVA), polyvinyl pyrrolidone (PVP), polymethyl methacrylate (PMMA), polymethacrylic acid (PMAA), polyacrylic acid (PAA), polyvinyl chloride (PC), polylactic acid (PLA), polycaprolactone (PCL), polyurethane (PU), polystyrene (PS), polyethylene oxide (PEO), polyvinyl acetate (PVAC), polyacrylonitrile (PAN), nylon, polyetherimide (PEI), polyester (PET), polyester sulfone (PES) and polybenzimidazole (PBI).

7. The method of claim 1, wherein the metal of the nanofiber web is one or more selected from the group consisting of aluminum, copper, silver, gold, chromium, nickel, platinum, titanium and an alloy thereof.

8. The method of claim 1, wherein the metal oxide nanoparticle of the nanofiber web is one or more selected from the group consisting of manganese dioxide ($MnO_2$), rubidium dioxide ($RuO_2$), and gadolinium oxide ($Gd_2O_3$).

9. The method of claim 1, further comprising impregnating one or more pairs of the electrolyte-coated nano/micro composite fibers with an electrolyte to form a second electrolyte layer.

10. The method of claim 1, wherein the electrolyte is selected from a gel electrolyte, a solid electrolyte, a polymer electrolyte, or a liquid electrolyte.

11. The method of claim 1, wherein when impregnating the nano/micro composite fiber with the electrolyte, the electrolyte is penetrated into the voids of the nano/micro composite fiber by using an electrophoresis method.

12. The method of claim 2, wherein, the heating is performed at a temperature between 80° C. and 85° C.

13. The method of claim 2, wherein the strong acid is selected from sulfuric acid, nitric acid or hydrochloric acid, or a mixed acid thereof.

14. The method of claim 2, wherein the graphene is a reduced graphene oxide.

15. The method of claim 2, wherein the material of the nanofiber is one or more selected from the group consisting of polyvinyl alcohol (PVA), polyvinyl pyrrolidone (PVP), polymethyl methacrylate (PMMA), polymethacrylic acid (PMAA), polyacrylic acid (PAA), polyvinyl chloride (PC), polylactic acid (PLA), polycaprolactone (PCL), polyurethane (PU), polystyrene (PS), polyethylene oxide (PEO), polyvinyl acetate (PVAC), polyacrylonitrile (PAN), nylon, polyetherimide (PEI), polyester (PET), polyester sulfone (PES) and polybenzimidazole (PBI).

16. The method of claim 2, wherein the metal of the nanofiber web is one or more selected from the group consisting of aluminum, copper, silver, gold, chromium, nickel, platinum, titanium and an alloy thereof.

17. The method of claim 2, wherein the metal oxide nanoparticle of the nanofiber web is one or more selected from the group consisting of manganese dioxide ($MnO_2$), rubidium dioxide ($RuO_2$), and gadolinium oxide ($Gd_2O_3$).

18. The method of claim 2, further comprising impregnating one or more pairs of the electrolyte-coated nano/micro composite fibers with an electrolyte to form a second electrolyte layer.

19. The method of claim 2, wherein the electrolyte is selected from a gel electrolyte, a solid electrolyte, a polymer electrolyte, or a liquid electrolyte.

20. The method of claim 2, wherein when impregnating the nano/micro composite fiber with the electrolyte, the electrolyte is penetrated into the voids of the nano/micro composite fiber by using an electrophoresis method.

* * * * *